(12) United States Patent
Park et al.

(10) Patent No.: US 8,354,677 B2
(45) Date of Patent: Jan. 15, 2013

(54) ORGANIC LIGHT EMITTING DIODE DISPLAY AND MANUFACTURING METHOD THEREOF

(75) Inventors: Jong-Hyun Park, Yongin (KR); Chun-Gi You, Yongin (KR); Sun Park, Yongin (KR); Yul-Kyu Lee, Yongin (KR); Kyu-Sik Cho, Yongin (KR); Sang-Ho Moon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 107 days.

(21) Appl. No.: 13/023,429

(22) Filed: Feb. 8, 2011

(65) Prior Publication Data
US 2011/0266544 A1 Nov. 3, 2011

(30) Foreign Application Priority Data
Apr. 30, 2010 (KR) ........................ 10-2010-0041008

(51) Int. Cl.
*H01L 27/28* (2006.01)
(52) U.S. Cl. ............... 257/72; 257/59; 257/71; 257/74; 257/E51.018; 438/29
(58) Field of Classification Search ........................ None
See application file for complete search history.

(56) References Cited

U.S. PATENT DOCUMENTS
2005/0145861 A1* 7/2005 Kawakami et al. ............ 257/88

FOREIGN PATENT DOCUMENTS
| JP | 2001-176660 | 6/2001 |
|---|---|---|
| KR | 10-2005-0070908 | 7/2005 |
| KR | 10-2009-0106099 | 10/2009 |

* cited by examiner

*Primary Examiner* — Fei Fei Yeung Lopez
(74) *Attorney, Agent, or Firm* — Christie, Parker & Hale, LLP

(57) ABSTRACT

An organic light emitting diode display, which can obtain a resonance effect by its metal mirror, and a manufacturing method thereof. The display includes a semiconductor layer, a dummy pattern layer, a gate insulating film, a pixel electrode, and a gate electrode. The semiconductor layer is formed of polysilicon on a base substrate. The dummy pattern layer is formed of polysilicon at a same layer level as the semiconductor layer and surrounds a light emitting region. The gate insulating film is on the base substrate while covering the semiconductor layer and the dummy pattern layer, and has recess portions corresponding to the light emitting region. The pixel electrode is filled in the recess portions, and is formed of a metal mirror multilayer including a transmissive conductive film and a reflective conductive film. The gate electrode is on the gate insulating film at a distance from the pixel electrode.

18 Claims, 6 Drawing Sheets

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2010-0041008, filed in the Korean Intellectual Property Office on Apr. 30, 2010, the entire contents of which are incorporated herein by reference.

BACKGROUND

1. Field

The described technology relates to an organic light emitting diode display. More particularly, the described technology relates to an organic light emitting diode display that can obtain a resonance effect by a metal mirror, and a manufacturing method thereof.

2. Description of the Related Art

An organic light emitting diode display is a self-emissive display device that is provided with organic light emitting diodes that emit light to display an image. Unlike liquid crystal displays, the organic light emitting diode display does not require a separate light source, and thus the thickness and weight thereof can be reduced. Moreover, the organic light emitting diode display represents high quality characteristics such as low power consumption, high luminance, quick response, and the like.

Recently, as the organic light emitting diode display has been applied to large display devices for household use, research for simplifying the structure and manufacturing method thereof has been underway to make the organic light emitting diode display suitable for large area thin film preparation. Further, research for increasing luminous efficiency by applying a resonance structure to the organic light emitting diode display is also underway. The resonance structure is a technique for improving luminous efficiency by confining light emitted from an organic emission layer in a certain space and oscillating the light.

The above information disclosed in this Background section is only for enhancement of understanding of the background of the described technology and therefore it may contain information that does not form the prior art that is already known in this country to a person of ordinary skill in the art.

SUMMARY

Aspects of embodiments of the present invention are directed toward an organic light emitting diode display with a simplified structure so as to be suitable for large area thin film preparation and to obtain a resonance effect by a metal mirror, and a simplified manufacturing method thereof.

An exemplary embodiment provides an organic light emitting diode display that includes: a semiconductor layer formed of polysilicon on a base substrate; a dummy pattern layer formed of polysilicon at a same layer level as the semiconductor layer and surrounding a light emitting region; a gate insulating film formed on the base substrate and covering the semiconductor layer and the dummy pattern layer, the gate insulating film having recess portions corresponding to the light emitting region; a pixel electrode filled in the recess portions and formed of a metal mirror multilayer film including a transmissive conductive film and a reflective conductive film; and a gate electrode on the gate insulating film at a distance from the pixel electrode.

In one embodiment, the dummy pattern layer is formed of a type of the polysilicon into which impurities are implanted.

In one embodiment, the organic light emitting diode display further includes a protective layer formed directly over the gate insulating film while covering an edge of the pixel electrode. In one embodiment, the gate electrode is on the protective layer, and is formed of a laminated structure of a first metal film and a second metal film, the first metal film including copper (Cu), a copper alloy, aluminum (Al), and/or an aluminum alloy, and the second metal film including molybdenum (Mo) or a molybdenum alloy. In one embodiment, the organic light emitting diode display further includes: a first capacitor plate formed of polysilicon and at the same layer level as the semiconductor layer; and a second capacitor plate formed of a same material as the gate electrode and at a same layer level as the gate electrode. In one embodiment, the first capacitor plate is formed of a type of the polysilicon not doped with impurities. In one embodiment, the organic light emitting diode display further includes: an interlayer insulating film on the protective layer while covering the gate electrode; a source electrode and a drain electrode, the source and the drain electrodes being on the interlayer insulating film; a pixel defining film on the source electrode and the drain electrode and having an opening exposing the pixel electrode; an organic emission layer on the pixel electrode; and a common electrode on the organic emission layer.

In one embodiment, the pixel electrode is formed of a multilayer film of a first transmissive conductive film, a reflective conductive film, and a second transmissive conductive film, the reflective conductive film being between the first and second transmissive conductive films; each of the first and second transmissive conductive films includes ITO, IZO, ZnO, and/or $In_2O_3$; and the reflective conductive film comprises silver (Ag), a silver alloy, aluminum (Al), and/or an aluminum alloy.

An exemplary embodiment provides a manufacturing method of an organic light emitting diode display, the method including: forming a dummy pattern layer surrounding a light emitting region and a semiconductor layer by forming a polysilicon film on a base substrate and then patterning the polysilicon film; forming a gate insulating film having recess portions corresponding to the light emitting region by applying an insulating material for covering the semiconductor layer and the dummy pattern layer onto the base substrate; forming a metal mirror multilayer film comprising a transmissive conductive film and a reflective conductive film on the gate insulating film; forming a pixel electrode filled in the recess portions by polishing the metal mirror multilayer film to expose the gate insulating film; forming a protective layer on the gate insulating film and the pixel electrode; and forming a gate electrode on the protective layer.

In one embodiment, the metal mirror multilayer film is formed of a multilayer film of a first transmissive conductive film, a reflective conductive film, and a second transmissive conductive film, the reflective conductive film being between the first and second transmissive conductive films; each of the first and second transmissive conductive films comprises ITO, IZO, ZnO, and/or $In_2O_3$; and the reflective conductive film comprises silver (Ag), a silver alloy, aluminum (Al), and/or an aluminum alloy.

In one embodiment, the metal mirror multilayer film is polished by a chemical mechanical polishing (CMP) process.

In one embodiment, the gate electrode is formed of a laminated structure of a first metal film and a second metal film, the first metal film comprising copper (Cu), a copper alloy, aluminum (Al), and/or an aluminum alloy, and the second metal film comprising molybdenum (Mo) or a molybdenum alloy. In one embodiment, the method further includes: forming a first capacitor plate by patterning the same polysilicon film forming the semiconductor layer; and forming a second capacitor plate formed of a same material as the gate electrode and at a same layer level as the gate electrode. In one embodiment, the method further includes: forming a pixel electrode intermediate with the forming of the gate electrode; and forming an interlayer insulating film having contact holes and an opening exposing the pixel electrode intermediate on the gate electrode and the pixel electrode; removing the pixel electrode intermediate while forming a source electrode and a drain electrode on the interlayer insulating film; and forming a pixel defining film having an opening exposing the pixel electrode on the source electrode and the drain electrode. In one embodiment, a part of the protective layer is removed together with the forming of the opening of the pixel defining film to expose the pixel electrode. In one embodiment, the method further includes: forming an organic emission layer on the pixel electrode; and forming a common electrode on the organic emission layer.

Here, an organic light emitting diode display according to an exemplary embodiment can provide a simplified structure and manufacturing method, and can form a pixel electrode having a metal mirror structure without an additional pattern mask. Accordingly, the organic light emitting diode display of this exemplary embodiment can improve luminous efficiency since it obtains a resonance effect of confining light emitted from the organic emission layer in a space between the common electrode and the pixel electrode and oscillating the light.

DETAILED DESCRIPTION

Figure 1:
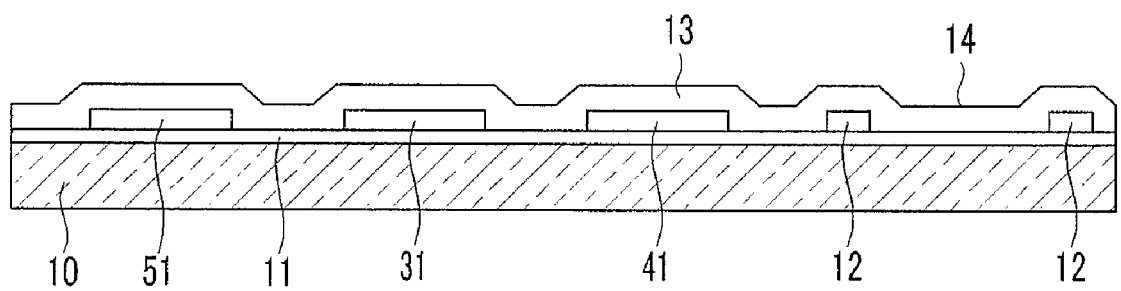
FIGS. 1, 2, 3, 4, 5, 6, 7, 8, 9, and 10 are cross-sectional views sequentially showing a manufacturing process of an organic light emitting diode display according to one exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In order to clarify the present invention, parts that are not related to descriptions are omitted, and the same or similar elements are given the same reference numerals throughout the specification. In addition, the size and thickness of each component shown in the drawings are arbitrarily shown for better understanding and ease of description, and thus the present invention is not limited to those shown in the drawings.

Throughout the specification, it will be understood that when an element such as a layer, film, region, or substrate is referred to as being "on" another element, it can be directly on the other element or intervening elements may also be present.

FIGS. 1 to 10 are cross-sectional views sequentially showing a manufacturing process of an organic light emitting diode display according to one exemplary embodiment. The organic light emitting diode display includes a plurality of pixels, and FIGS. 1 to 10 show a structure of one pixel of the organic light emitting diode display for convenience.

Referring to FIG. 1, a buffer layer 11 is formed on a base substrate 10. The base substrate 10 may be formed of a transparent insulation substrate made of glass, quartz, and/or plastic. The buffer layer 11 may be formed of a single film of silicon nitride or a laminated film of silicon nitride and silicon oxide, and is deposited over the entire surface of the base substrate 10 by a method such as plasma enhanced chemical vapor deposition (PECVD).

A polysilicon film is formed on the buffer layer 11. The polysilicon film may be formed by forming an amorphous silicon film and then crystallizing it. Various suitable methods may be applied as a crystallization method, and the amorphous silicon film can be crystallized using heat, laser, Joule's heat, an electric field, a catalyst metal, or the like.

The polysilicon film is patterned by photolithography by using a first pattern mask. As such, a switching semiconductor layer 31, a driving semiconductor layer 41, a first capacitor plate 51, and a dummy pattern layer 12 for forming a pixel electrode are simultaneously formed. The dummy pattern layer 12 is located outside a light emitting region in which an organic emission layer is to be located later, and is formed in the shape of a ring surrounding the light emitting region. For example, the dummy pattern layer 12 may have a rectangular frame shape having a certain width.

A gate insulating film 13 is formed on the switching semiconductor layer 31, the driving semiconductor layer 41, the first capacitor plate 51, and the dummy pattern layer 12. The gate insulating film 13 may be formed of a laminated film of silicon nitride and tetraethoxysilane (TEOS), and is deposited over the entire surface of the buffer layer 11 by a method such as PECVD.

The gate insulating film 13 has stepped portions formed by the thickness of the switching semiconductor layer 31, driving semiconductor layer 41, first capacitor plate 51, and dummy pattern layer 12 that were previously formed. That is, a plurality of recess portions 14 are formed on the upper surface of the gate insulating film 13 because regions of the gate insulating film 13 contacting the buffer layer 11 are located lower than other regions. The depth of the recess portions 14 may be equal to the thickness of the polysilicon film.

Figure 2:
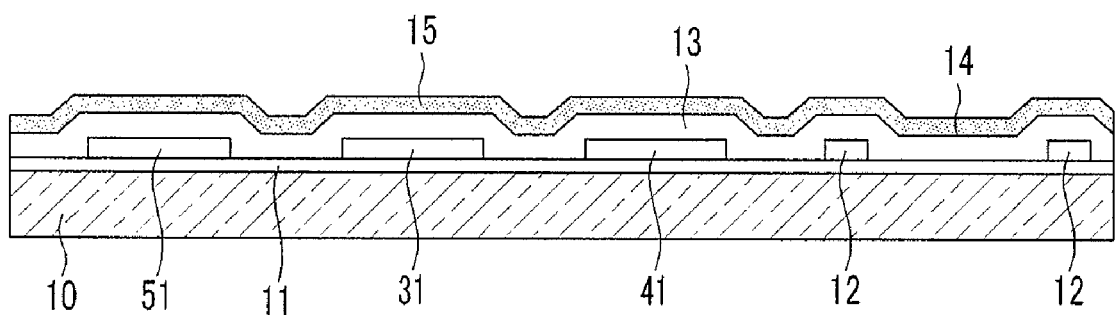

Referring to FIG. 2, a metal mirror multilayer film 15 is formed on the gate insulating film 13. The metal mirror multilayer film 15 is formed in a structure in which a reflective conductive film is laminated between two transmissive conductive films. The transmissive conductive films may include indium tin oxide (ITO), indium zinc oxide (IZO), ZnO, and/or In$_2$O$_3$. The reflective conductive film may include silver (Ag), a silver alloy, aluminum (Al), and/or an aluminum alloy. The metal mirror multilayer film 15 may be formed of a three-layered film of ITO/Ag/ITO or a three-layered film of ITO/Al/ITO.

The metal mirror multilayer film 15 also has set or predetermined stepped portions corresponding to the stepped portions of the previously formed gate insulating film 13. That is, regions of the metal mirror multilayer film 15 corresponding to the recess portions 14 of the gate insulating film 13 are located lower than other regions.

Figure 3:
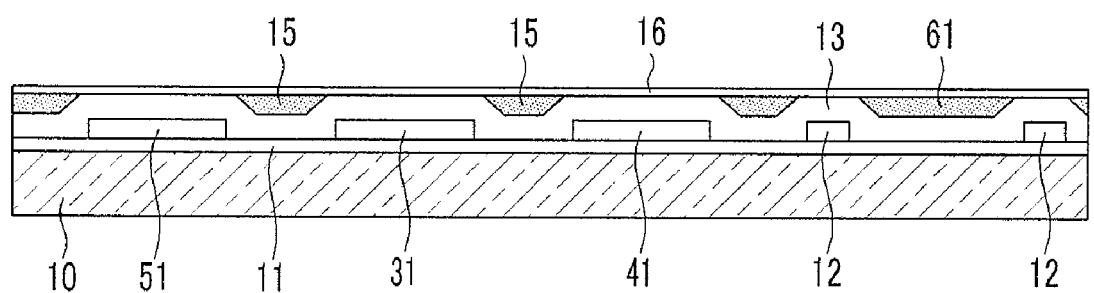

Referring to FIG. 3, the metal mirror multilayer film 15 is polished so as to expose the upper surface of the gate insulating film 13. As the polishing method, a chemical mechanical polishing (CMP) process may be applied. Then, portions of the metal mirror multilayer film 15 received in the recess portions 14 of the gate insulating film 13 remain, and the other portions are removed. Of the remaining metal mirror multilayer film 15, a portion surrounded by the dummy pattern layer 12 forms a pixel electrode 61 having a metal mirror structure.

A protective layer 16 is formed on the gate insulating film 13 and the metal mirror multilayer film 15. The protective layer 16 may be a single layer of silicon oxide, and may have a thickness of about 200 Å to about 300 Å. The protective layer 16 serves to prevent or protect the pixel electrode 61 from being damaged by an aluminum etchant in a patterning process of a gate metal layer and/or a patterning process of a source electrode and a drain electrode that will be performed later. Further, the protective layer 16 serves to compensate for the thickness of the gate insulating film 13 polished by the polishing process. The material and thickness of the protective layer 16 are not limited to the above-mentioned example.

Figure 4:
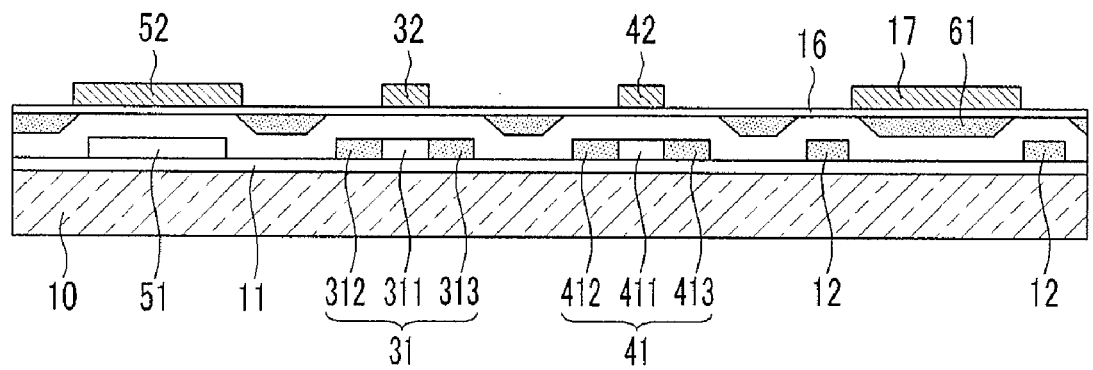

Referring to FIG. 4, a gate metal layer is formed on the protective layer 16. The gate metal layer may be formed of a laminated multilayer film composed of a metal film including one of copper (Cu), a copper alloy, aluminum (Al), and an aluminum alloy, and a metal film including one of molybdenum (Mo) and a molybdenum alloy. For example, the gate metal layer may be formed of a three-layered film of Mo/Al/Mo or a three-layered film of Mo/Cu/Mo.

The gate metal layer is patterned by photolithography by using a second pattern mask. As such, a switching gate electrode 32, a driving gate electrode 42, a second capacitor plate 52, and a pixel electrode intermediate 17 are formed. At this time, a low resistance wiring layer such as a gate line may be simultaneously or commonly formed. The pixel electrode intermediate 17 is located on the pixel electrode 61, and may have the same size as the pixel electrode 61.

By doping the switching semiconductor layer 31 and the driving semiconductor layer 41 with impurities, the switching semiconductor layer 31 and the driving semiconductor layer 41 are respectively divided into channel regions 311 and 411, source regions 312 and 412, and drain regions 313 and 413. Here, the channel regions 311 and 411 are intrinsic semiconductors that are not doped with impurities, and the source regions 312 and 412 and the drain regions 313 and 413 are impurity semiconductors that are doped with impurities. In this process, the dummy pattern layer 12 may also be doped with impurities. The switching gate electrode 32 and the driving gate electrode 42 serve to prevent or protect the channel regions 311 and 411 from being doped with impurities when the source regions 312 and 412 and the drain regions 313 and 413 are being doped with impurities.

Figure 5:
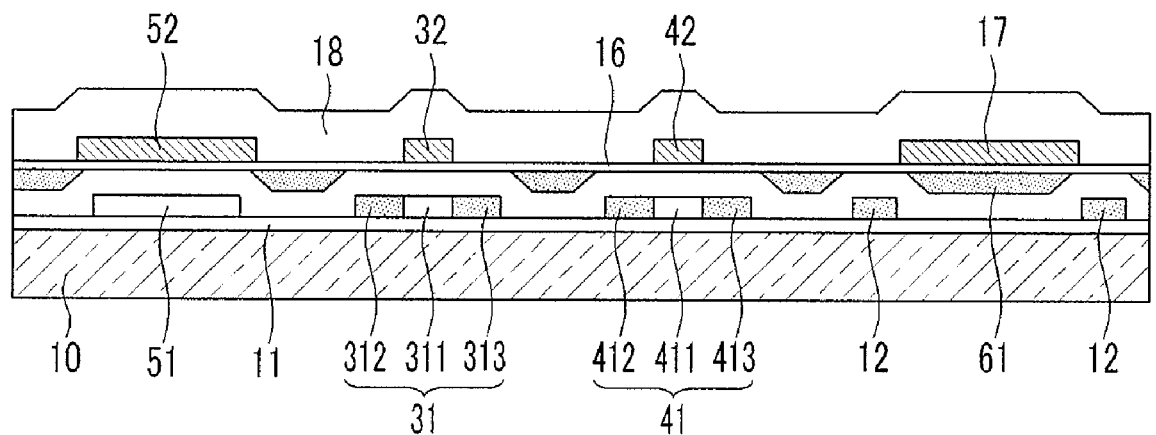

Referring to FIG. 5, an interlayer insulating film 18 is formed on the switching gate electrode 32, the driving gate electrode 42, the second capacitor plate 52, and the pixel electrode intermediate 17. The interlayer insulating film 18 is formed of an organic film and/or an inorganic film, and is deposited over the entire surface of the base substrate 10.

Figure 6:
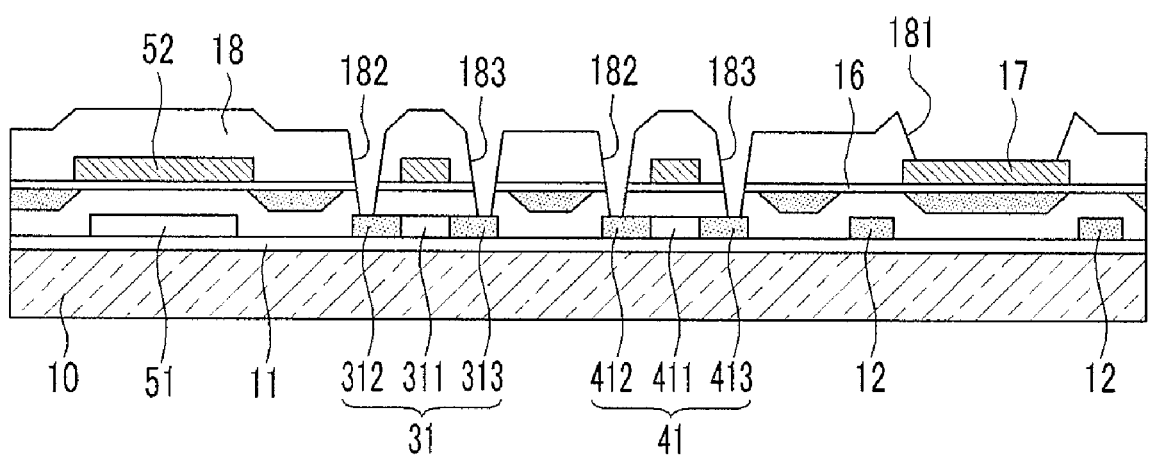

Referring to FIG. 6, the interlayer insulating film 18 is patterned by photolithography by using a third pattern mask to form an opening 181 and contact holes 182 and 183. The opening 181 of the interlayer insulating film 18 exposes a part of the pixel electrode intermediate 17.

The contact holes 182 and 183 of the interlayer insulating film 18 include source contact holes 182 exposing the source regions 312 and 412 of the switching semiconductor layer 31 and driving semiconductor layer 41, and drain contact holes 183 exposing the drain regions 313 and 413. The source contact holes 182 and the drain contact holes 183 are formed together with the removal of the interlayer insulating film 18, the protective layer 16, and the gate insulating film 13.

Figure 7:
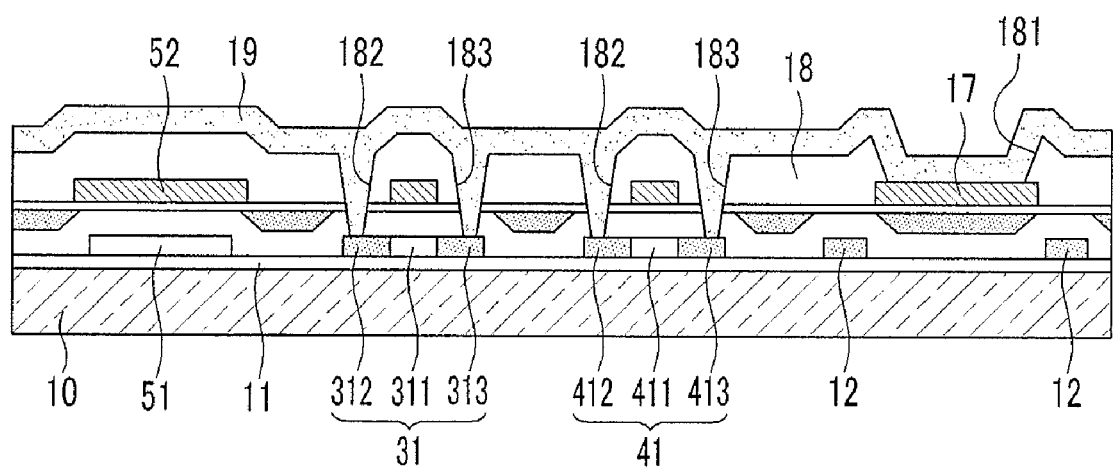

Referring to FIG. 7, a data metal layer 19 is formed on the interlayer insulating film 18. Like the gate metal layer (see FIG. 4), the data metal layer 19 may be formed of a laminated multilayer film composed of a metal film including one of copper, a copper alloy, aluminum, and an aluminum alloy, and a metal film including one of molybdenum and a molybdenum alloy. For example, the data metal layer 19 may be formed of a three-layered film of Mo/Al/Mo or a three-layered film of Mo/Cu/Mo.

The data metal layer 19 contacts the pixel electrode intermediate 17 through the opening 181 of the interlayer insulating film 18. Also, the data metal layer contacts the source regions 312 and 412 and drain regions 313 and 413 of the switching semiconductor layer 31 and driving semiconductor layer 41 through the source contact holes 182 and the drain contact holes 183.

Figure 8:
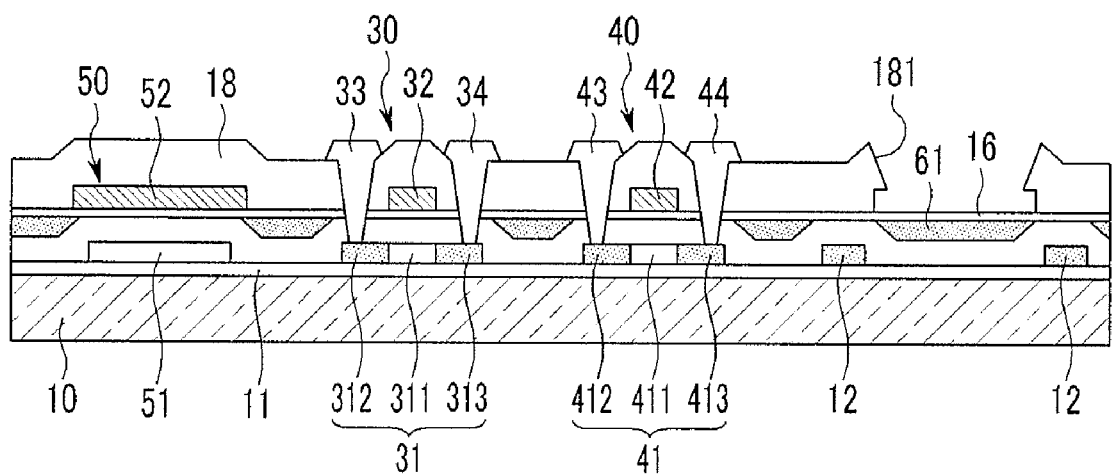

Referring to FIG. 8, the data metal layer 19 is patterned by photolithography by using a fourth pattern mask. As such, a switching source electrode 33, a switching drain electrode 34, a driving source electrode 43, and a driving drain electrode 44 are formed, and the pixel electrode intermediate 17 exposed through the opening 181 of the interlayer insulating film 18 is removed. At this time, a low resistance wiring layer such as a data line and a common power line may be simultaneously formed.

The data metal layer 19 and the pixel electrode intermediate 17 are formed of the same material. Thus, the data metal layer 19 and the pixel electrode intermediate 17 contacting each other through the opening 181 of the interlayer insulating film 18 may be simultaneously or commonly removed by one etching process using the same etching solution. In this process, the protective layer 16 covers and protects the pixel electrode 61, thereby preventing or blocking the etching solution from damaging the pixel electrode 61.

That is, the component, e.g., aluminum of the reflective conductive film of the pixel electrode 61 may be the same as a partial component of the multilayer film constituting the pixel electrode intermediate 17. Thus, in the absence of the protective layer 16, the pixel electrode 61 would be removed by the etching solution together with the removal of the data metal layer 19 and the pixel electrode intermediate 17. In this exemplary embodiment, however, the pixel electrode 61 is not damaged because the protective layer 16 covers and protects the pixel electrode 61.

A switching thin film transistor 30 includes the switching semiconductor layer 31, the switching gate electrode 32, the switching source electrode 33, and the switching drain electrode 34. A driving thin film transistor 40 includes the driving semiconductor layer 41, the driving gate electrode 42, the driving source electrode 43, and the driving drain electrode 44. A capacitor 50 includes the first capacitor plate 51 and the second capacitor plate 52 that are located with the gate insulating film 13 interposed therebetween.

Figure 9:
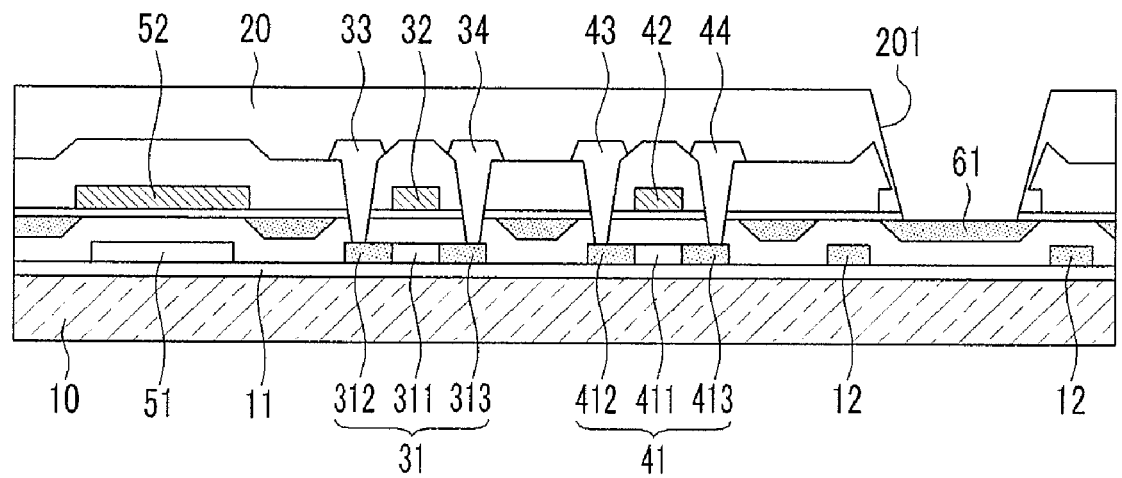

Referring to FIG. 9, a pixel defining film 20 is formed on the interlayer insulating film 18 so as to cover the switching source electrode 33, the switching drain electrode 34, the driving source electrode 43, and the driving drain electrode 44. Moreover, an opening 201 exposing a part of the pixel electrode 61 is formed in the pixel defining film 20 by using a fifth pattern mask. At this point, the opening 201 corresponds to the light emitting region, and a portion of the protective layer 16 exposed by the opening 201 is removed, along with the pixel defining film 20, by the etching solution, e.g., a hydrofluoric acid etching solution.

Figure 10:
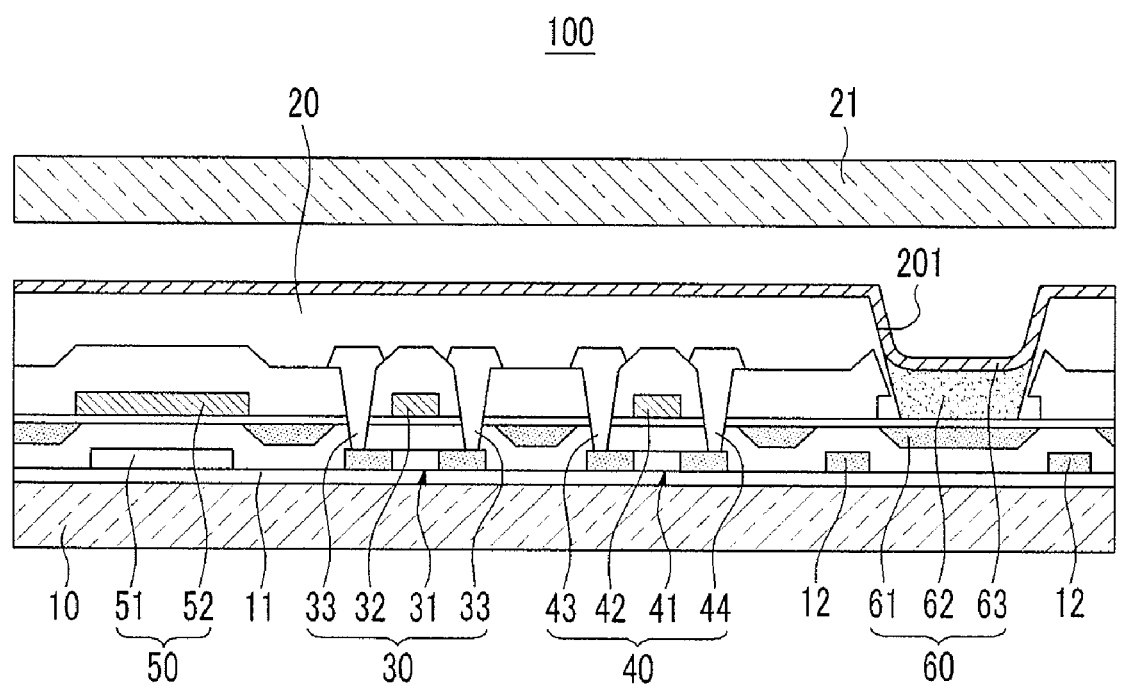

Referring to FIG. 10, an organic emission layer 62 is formed on the pixel electrode 61 exposed through the opening 201 of the pixel defining film 20. Then, a common electrode 63 is formed on the organic emission layer 62 to complete an organic light emitting diode 60. The common electrode 63 is also formed on the pixel defining film 20 and is therefore formed across a plurality of pixels. The pixel electrode 61 may be a hole injection electrode (anode), and the common electrode 63 may be an electron injection electrode (cathode).

The organic emission layer 62 is formed of a multilayer film including a hole injection layer, a hole transport layer, an emission layer, an electron transport layer, and an electron injection layer. If the pixel electrode 61 is an anode, the hole injection layer, the hole transport layer, the emission layer, the electron transport layer, and the electron injection layer are sequentially laminated on the pixel electrode 61. Note that the above-mentioned layers other than the emission layer may be suitably omitted as required or desired, and the layers other than the emission layer may also be formed on the pixel defining film.

The common electrode 63 is formed of a metal having high light reflectance and low resistance. For example, the common electrode 63 may include magnesium (Mg), silver (Ag), gold (Au), calcium (Ca), chromium (Cr), aluminum (Al), or alloys thereof. Therefore, the light emitted from the organic emission layer 62 is reflected by the common electrode 63, and is transmitted outside through the pixel electrode 61 and the base substrate 10, thereby displaying an image. That is, the organic light emitting diode display 100 of this exemplary embodiment has a bottom emission structure.

An encapsulation member 21 for protecting the organic light emitting diode 60 and the thin film transistors 30 and 40 is disposed on the common electrode 63. The encapsulation member 21 may seal the base substrate 10 by a sealant, and may be formed of various suitable materials such as glass, quartz, ceramic, plastic, and metal. Alternatively, an encapsulating thin film layer may be formed on the common electrode 63 by depositing an inorganic film and an organic film thereon without using the sealant.

In this manner, the organic light emitting diode display 100 of this exemplary embodiment can provide a simplified structure and manufacturing method by using five pattern masks, and can form a pixel electrode having a metal mirror structure. That is, the dummy pattern layer 12 can be formed by changing the first pattern mask for patterning the polysilicon film, and the pixel electrode 61 having the metal mirror structure can be formed without an additional pattern mask for obtaining a metal mirror by the process of depositing the metal mirror multilayer film 15 on the entire surface of the gate insulating film 13 and polishing it.

Therefore, the organic light emitting diode display 100 of this exemplary embodiment can obtain a resonance effect by confining the light emitted from the organic emission layer 62 in a space between the common electrode 63 and the pixel electrode 61 and oscillating the light. That is, a part of the light emitted from the organic emission layer 62 is reflected toward the common electrode 63 by using the reflective conductive film laminated between the transmissive conductive films. As a result, the organic light emitting diode display 100 of this exemplary embodiment can improve luminous efficiency by obtaining a resonance effect.

According to the aforementioned manufacturing method, the dummy pattern layer 12 for defining a formation region of the pixel electrode 61 is located on the buffer layer 11 outside the pixel electrode 61. The dummy pattern layer 12 is formed of a polysilicon film, and may be an impurity semiconductor into which impurities are implanted. Also, the metal mirror multilayer film 15 may remain around the switching thin film transistor 30, the driving thin film transistor 40, and the capacitor 50.

Moreover, the first capacitor plate 51 of the capacitor 50 is formed of an intrinsic semiconductor into which impurities are not implanted, and the second capacitor plate 52 of the capacitor 50 is formed of the same material as the switching gate electrode 32 and the driving gate electrode 42. That is, the second capacitor plate 52 is formed as a three-layered film of Mo/Al/Mo or a three-layered film of Mo/Cu/Mo.

Although FIG. 10 shows parallel placement of the organic light emitting diode 60, the driving thin film transistor 40, the switching thin film transistor 30, and the capacitor 50 for convenience of explanation, they do actually have to be placed in parallel to each other. Further, illustration of the wiring layer including a gate line, a data line, and a common power line is omitted for convenience of explanation.

Figure 11:
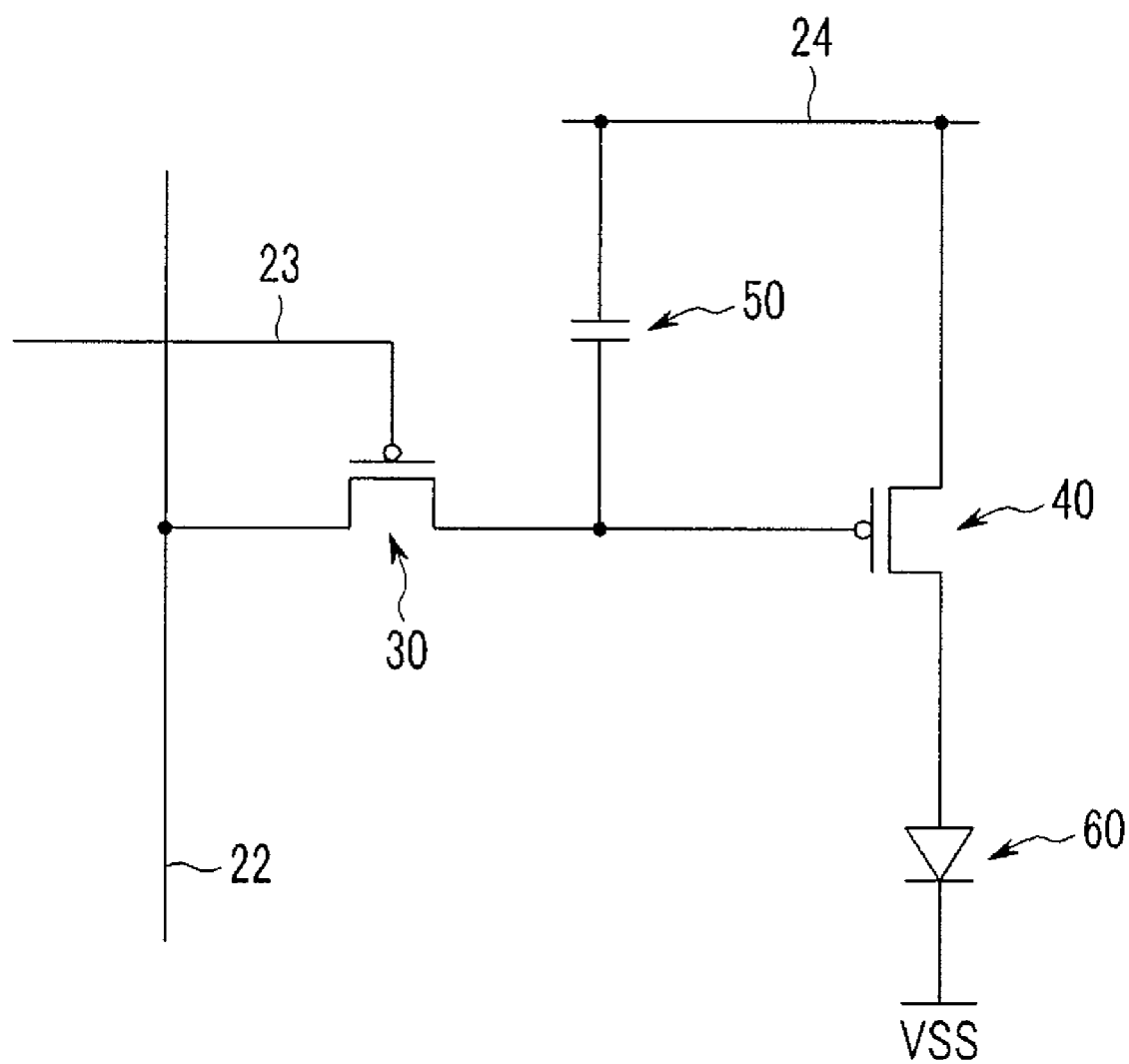
FIG. 11 is a circuit diagram showing a pixel configuration of the organic light emitting diode display according to one exemplary embodiment.

FIG. 11 is a circuit diagram showing a pixel configuration of the organic light emitting diode display according to one exemplary embodiment.

Referring to FIG. 11, one pixel includes an organic light emitting diode 60, two thin film transistors 30 and 40, and one capacitor 50. However, this exemplary embodiment is not limited thereto, and one pixel may include three or more thin film transistors and two or more capacitors. The thin film transistors and capacitors to be additionally formed can constitute a compensation circuit for increasing the uniformity of the organic light emitting diodes formed in a number of pixels.

A data line 22 is connected to a source electrode of the switching thin film transistor 30, and a gate line 23 is connected to a gate electrode of the switching thin film transistor 30. The drain electrode of the switching thin film transistor 30 is connected to one of the first and second capacitor plates of the capacitor 50 and to the gate electrode of the driving thin film transistor 40. The drain electrode of the driving thin film transistor 40 is connected to the pixel electrode of the organic light emitting diode 60. The source electrode of the driving thin film transistor 40 is connected to the other one of the first and second capacitor plates and to a common power line 24.

The switching thin film transistor 30 operates by a voltage applied to the gate line 23 and transfers a data voltage applied to the data line 22 to the driving thin film transistor 40. The capacitor 50 stores a voltage corresponding to a voltage difference between the common voltage applied to the driving thin film transistor 40 from the common power line 24 and the data voltage transferred from the switching thin film transistor 30, and current corresponding to the voltage stored in the capacitor 50 flows to the organic light emitting diode 60 through the driving thin film transistor 40, thereby making the organic emission layer emit light.

The pixel configuration of the organic light emitting diode display is not limited to the configuration described above, but may be modified in various suitable forms within the scope in which a person skilled in the art can easily change.

| Description of symbols | | | |
|---|---|---|---|
| 100: | organic light emitting diode (OLED) display | 10: | base substrate |
| 11: | buffer layer | 12: | dummy pattern layer |
| 13: | gate insulating film | 14: | recess portion |
| 15: | metal mirror multilayer film | 16: | protective layer |
| 17: | pixel electrode intermediate | 18: | interlayer insulating film |
| 19: | data metal layer | 20: | pixel defining film |
| 30: | switching thin film transistor | 40: | driving thin film transistor |
| 50: | capacitor | 60: | organic light emitting diode |
| 61: | pixel electrode | 62: | organic emission layer |
| 63: | common electrode | | |

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting diode display comprising: a semiconductor layer formed of polysilicon on a base substrate; a dummy pattern layer formed of polysilicon at a same layer level as the semiconductor layer and surrounding a light emitting region; a gate insulating film formed on the base substrate, formed between the semiconductor layer and a gate electrode, and covering the semiconductor layer and the dummy pattern layer, the gate insulating film having recess portions corresponding to the light emitting region; a pixel electrode filled in the recess portions and formed of a metal mirror multilayer film comprising a transmissive conductive film and a reflective conductive film, wherein the pixel electrode touches the portions of the gate insulating film that form sidewalls and the bottom of the recess; and the gate electrode on the gate insulating film at a distance from the pixel electrode.

2. The organic light emitting diode display of claim 1, wherein the dummy pattern layer is formed of a type of the polysilicon into which impurities are implanted.

3. The organic light emitting diode display of claim 1, further comprising a protective layer formed directly over the gate insulating film while covering an edge of the pixel electrode.

4. The organic light emitting diode display of claim 3, wherein the gate electrode is on the protective layer, and is formed of a laminated structure of a first metal film and a second metal film, the first metal film comprising copper (Cu), a copper alloy, aluminum (Al), and/or an aluminum alloy, and the second metal film comprising molybdenum (Mo) or a molybdenum alloy.

5. The organic light emitting diode display of claim 4, further comprising:
an interlayer insulating film on the protective layer while covering the gate electrode;
a source electrode and a drain electrode, the source and the drain electrodes being on the interlayer insulating film;
a pixel defining film on the source electrode and the drain electrode and having an opening exposing the pixel electrode;
an organic emission layer on the pixel electrode; and
a common electrode on the organic emission layer.

6. The organic light emitting diode display of claim 4, further comprising:
a first capacitor plate formed of polysilicon and at the same layer level as the semiconductor layer; and
a second capacitor plate formed of a same material as the gate electrode and at a same layer level as the gate electrode.

7. The organic light emitting diode display of claim 6, further comprising:
an interlayer insulating film on the protective layer while covering the gate electrode;
a source electrode and a drain electrode, the source and the drain electrodes being on the interlayer insulating film;
a pixel defining film on the source electrode and the drain electrode and having an opening exposing the pixel electrode;
an organic emission layer on the pixel electrode; and
a common electrode on the organic emission layer.

8. The organic light emitting diode display of claim 6, wherein the first capacitor plate is formed of a type of the polysilicon not doped with impurities.

9. The organic light emitting diode display of claim 8, further comprising:
an interlayer insulating film on the protective layer while covering the gate electrode;
a source electrode and a drain electrode, the source and the drain electrodes being on the interlayer insulating film;
a pixel defining film on the source electrode and the drain electrode and having an opening exposing the pixel electrode;
an organic emission layer on the pixel electrode; and
a common electrode on the organic emission layer.

10. The organic light emitting diode display of claim 1, wherein:
the pixel electrode is formed of a multilayer film of a first transmissive conductive film, a reflective conductive film, and a second transmissive conductive film, the reflective conductive film being between the first and second transmissive conductive films;
each of the first and second transmissive conductive films comprises ITO, IZO, ZnO, and/or $In_2O_3$; and
the reflective conductive film comprises silver (Ag), a silver alloy, aluminum (Al), and/or an aluminum alloy.

11. A manufacturing method of an organic light emitting diode display, the method comprising: forming a dummy pattern layer surrounding a light emitting region and a semiconductor layer by forming a polysilicon film on a base substrate and then patterning the polysilicon film, wherein the dummy pattern layer and the semiconductor layer are at a same level; forming a gate insulating film having recess portions corresponding to the light emitting region by applying an insulating material for covering the semiconductor layer and the dummy pattern layer onto the base substrate, wherein the gate insulating film is between the semiconductor layer and a gate electrode; forming a metal mirror multilayer film comprising a transmissive conductive film and a reflective conductive film on the gate insulating film; forming a pixel electrode filled in the recess portions by polishing the metal mirror multilayer film to expose the gate insulating film, wherein the pixel electrode touches the portions of the gate insulating film that form sidewalls and the bottom of the recess; forming a protective layer on the gate insulating film and the pixel electrode; and forming the gate electrode on the protective layer.

12. The method of claim 11, wherein:
the metal mirror multilayer film is formed of a multilayer film of a first transmissive conductive film, a reflective conductive film, and a second transmissive conductive film, the reflective conductive film being between the first and second transmissive conductive films;
each of the first and second transmissive conductive films comprises ITO, IZO, ZnO, and/or $In_2O_3$; and
the reflective conductive film comprises silver (Ag), a silver alloy, aluminum (Al), and/or an aluminum alloy.

13. The method of claim 11, wherein the metal mirror multilayer film is polished by a chemical mechanical polishing (CMP) process.

14. The method of claim 11, wherein the gate electrode is formed of a laminated structure of a first metal film and a second metal film, the first metal film comprising copper (Cu), a copper alloy, aluminum (Al), and/or an aluminum alloy, and the second metal film comprising molybdenum (Mo) or a molybdenum alloy.

15. The method of claim 14, further comprising:

forming a first capacitor plate by patterning the same polysilicon film forming the semiconductor layer; and forming a second capacitor plate formed of a same material as the gate electrode and at a same layer level as the gate electrode.

16. The method of claim 14, further comprising:

forming a pixel electrode intermediate with the forming of the gate electrode;

forming an interlayer insulating film having contact holes and an opening exposing the pixel electrode intermediate on the gate electrode and the pixel electrode;

removing the pixel electrode intermediate while forming a source electrode and a drain electrode on the interlayer insulating film; and forming a pixel defining film having an opening exposing the pixel electrode on the source electrode and the drain electrode.

17. The method of claim 16, wherein a part of the protective layer is removed together with the forming of the opening of the pixel defining film to expose the pixel electrode.

18. The method of claim 17, further comprising:

forming an organic emission layer on the pixel electrode; and forming a common electrode on the organic emission layer.

* * * * *